(12) United States Patent
Volkovich et al.

(10) Patent No.: US 11,635,682 B2
(45) Date of Patent: Apr. 25, 2023

(54) SYSTEMS AND METHODS FOR FEEDFORWARD PROCESS CONTROL IN THE MANUFACTURE OF SEMICONDUCTOR DEVICES

(71) Applicant: KLA Corporation, Milpitas, CA (US)

(72) Inventors: Roie Volkovich, Hadera (IL); Liran Yerushalmi, Zicron Yaacob (IL); Achiam Bar, Gan-Ner (IL)

(73) Assignee: KLA Corporation, Milpitas, CA (US)

( * ) Notice: Subject to any disclaimer, the term of this patent is extended or adjusted under 35 U.S.C. 154(b) by 324 days.

(21) Appl. No.: 16/766,807

(22) PCT Filed: Apr. 23, 2020

(86) PCT No.: PCT/US2020/029421
§ 371 (c)(1),
(2) Date: May 26, 2020

(87) PCT Pub. No.: WO2020/263391
PCT Pub. Date: Dec. 30, 2020

(65) Prior Publication Data
US 2022/0004096 A1 Jan. 6, 2022

Related U.S. Application Data

(60) Provisional application No. 62/867,151, filed on Jun. 26, 2019.

(51) Int. Cl.
*G03F 7/20* (2006.01)
*G03F 1/70* (2012.01)
*G01B 11/24* (2006.01)

(52) U.S. Cl.
CPC ............ *G03F 1/70* (2013.01); *G03F 7/70525* (2013.01); *G03F 7/70616* (2013.01); *G01B 11/24* (2013.01)

(58) Field of Classification Search
CPC ....... G01B 11/24; G03F 1/70; G03F 7/70525; G03F 7/70616; H01L 21/67276;
(Continued)

(56) References Cited

U.S. PATENT DOCUMENTS 6,708,129 B1    3/2004  Pasadyn et al.
11,018,064 B2 *  5/2021  Volkovich ............... H01L 22/12
(Continued)

FOREIGN PATENT DOCUMENTS

KR          100860135 B1    9/2008

OTHER PUBLICATIONS

WIPO, ISR for PCT/US2020/029421, Aug. 5, 2020.

*Primary Examiner* — Deoram Persaud
(74) *Attorney, Agent, or Firm* — Hodgson Russ LLP (57) ABSTRACT

A method for process control in the manufacture of semiconductor devices including performing metrology on at least one Design of Experiment (DOE) semiconductor wafer included in a lot of semiconductor wafers, the lot forming part of a batch of semiconductor wafer lots, generating, based on the metrology, one or more correctables to a process used to manufacture the lot of semiconductor wafers and adjusting, based on the correctables, the process performed on at least one of; other semiconductor wafers included in the lot of semi-conductor wafers, and other lots of semiconductor wafers included in the batch.

16 Claims, 4 Drawing Sheets

(58) Field of Classification Search
CPC ... H01L 21/67288; H01L 22/12; H01L 22/20; C07C 303/02; C07C 303/28; C07C 309/75
See application file for complete search history.

(56) References Cited

U.S. PATENT DOCUMENTS

| | | |
|---|---|---|
| 2008/0316442 A1 | 12/2008 | Adel et al. |
| 2013/0155406 A1 | 6/2013 | Den Boef |
| 2015/0170904 A1* | 6/2015 | Tsen .................. G03F 9/7003 355/53 |
| 2015/0323316 A1* | 11/2015 | Shchegrov ......... G01N 21/9501 702/150 |
| 2016/0109230 A1 | 4/2016 | Pandev et al. |
| 2018/0023950 A1* | 1/2018 | Marciano ........... G03F 7/70616 702/150 |
| 2020/0050180 A1* | 2/2020 | Kou .................. G03F 7/70525 |
| 2021/0216021 A1* | 7/2021 | Demirer ............. G03F 7/70633 |
| 2022/0013468 A1* | 1/2022 | Volkovich ........... G03F 7/70625 |
| 2022/0291590 A1* | 9/2022 | Su ......................... G03F 7/705 |
| 2022/0334500 A1* | 10/2022 | Yagubizade ........ G03F 7/70633 |

* cited by examiner

SYSTEMS AND METHODS FOR FEEDFORWARD PROCESS CONTROL IN THE MANUFACTURE OF SEMICONDUCTOR DEVICES

REFERENCE TO RELATED APPLICATIONS

Reference is hereby made to U.S. Provisional Patent Application Ser. No. 62/867,151, filed Jun. 26, 2019 and entitled OVERLAY FEED FORWARD CONTROL, the disclosure of which is hereby incorporated by reference and priority of which is hereby claimed.

FIELD OF THE INVENTION

The present invention relates generally to metrology and more particularly to the measurement of misregistration in the manufacture of semiconductor devices.

BACKGROUND OF THE INVENTION

Various systems and methods for the measurement of misregistration in the manufacture of semiconductor devices are known in the art.

SUMMARY OF THE INVENTION

The present invention seeks to provide novel systems and methods for feedforward control in the processing of semiconductor devices, based on misregistration measurements performed on Design of Experiment (DOE) semiconductor wafers.

There is thus provided in accordance with a preferred embodiment of the present invention a method for process control in the manufacture of semiconductor devices including performing metrology on at least one Design of Experiment (DOE) semiconductor wafer included in a lot of semiconductor wafers, the lot forming part of a batch of semiconductor wafer lots, generating, based on the metrology, one or more correctables to a process used to manufacture the lot of semiconductor wafers and adjusting, based on the correctables, the process performed on at least one of: other semiconductor wafers included in the lot of semiconductor wafers, and other lots of semiconductor wafers included in the batch.

Preferably, the process includes a lithographic patterning process performed by a lithographic patterning tool.

Preferably, the metrology includes measurement of misregistration between layers of the DOE semiconductor wafer.

Preferably, the method also includes performing the process used to manufacture the lot of semiconductor wafers during the performing of the metrology, prior to the adjusting of the process.

Preferably, the method also includes generating the DOE semiconductor wafer prior to the performing of the metrology thereon.

Preferably, the generating the DOE semiconductor wafer includes varying at least one DOE parameter across the DOE semiconductor wafer.

Preferably, the DOE parameter includes one of misalignment of targets used for measurement of misregistration between layers of the DOE semiconductor wafer and other parameters related to misregistration between the layers of the DOE semiconductor wafer.

Preferably, the other parameters related to misregistration include parameters of the lithography patterning tool including translation, rotation, focus and dose.

Preferably, the varying of the DOE parameter includes at least one of varying the DOE parameter per field of the DOE semiconductor wafer and per die of the DOE semiconductor wafer.

Additionally or alternatively, the method also includes generating, based on the metrology, one or more correctables to performance of the metrology, whereby the performance of the metrology is optimized.

There is also provided, in accordance with another preferred embodiment of the present invention, a system for process control in the manufacture of semiconductor devices including a metrology tool operative to perform metrology on at least one Design of Experiment (DOE) semiconductor wafer included in a lot of semiconductor wafers, the lot forming part of a batch of semiconductor wafer lots, a correctable generator operative to generate, based on the metrology, one or more correctables to a process used to manufacture the lot of semiconductor wafers, and a controller operative to receive the correctables generated by the correctable generator and to controllably adjust the process, in accordance with the correctables, performed on at least one of other semiconductor wafers included in the lot of semiconductor wafers, and other lots of semiconductor wafers included in the batch of lots.

Preferably, the process includes a lithographic patterning process performed by a lithographic patterning tool.

Preferably, the metrology includes measurement of misregistration between layers of the DOE semiconductor wafer.

Preferably, the lithographic patterning tool is operative to perform the process to manufacture the lot of semiconductor wafers during performance of the metrology, prior to the process being adjusted by the controller.

Preferably, the lithographic patterning tool is operative to generate the DOE semiconductor wafer.

Preferably, the lithographic patterning tool is operative to vary at least one DOE parameter across the DOE semiconductor wafer.

Preferably, the DOE parameter includes one of misalignment of targets used for measurement of misregistration between layers of the DOE semiconductor wafer and other parameters related to misregistration between the layers of the DOE semiconductor wafer.

Preferably, the other parameters related to misregistration include parameters of the lithography patterning tool including translation, rotation, focus and dose.

Preferably, the DOE parameter is varied per at least one of a field of the DOE semiconductor wafer and a die of the DOE semiconductor wafer.

Additionally or alternatively, the correctable generator is operative to generate, based on the metrology, one or more correctables to performance of the metrology by the metrology tool, whereby the performance of the metrology tool is optimized.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
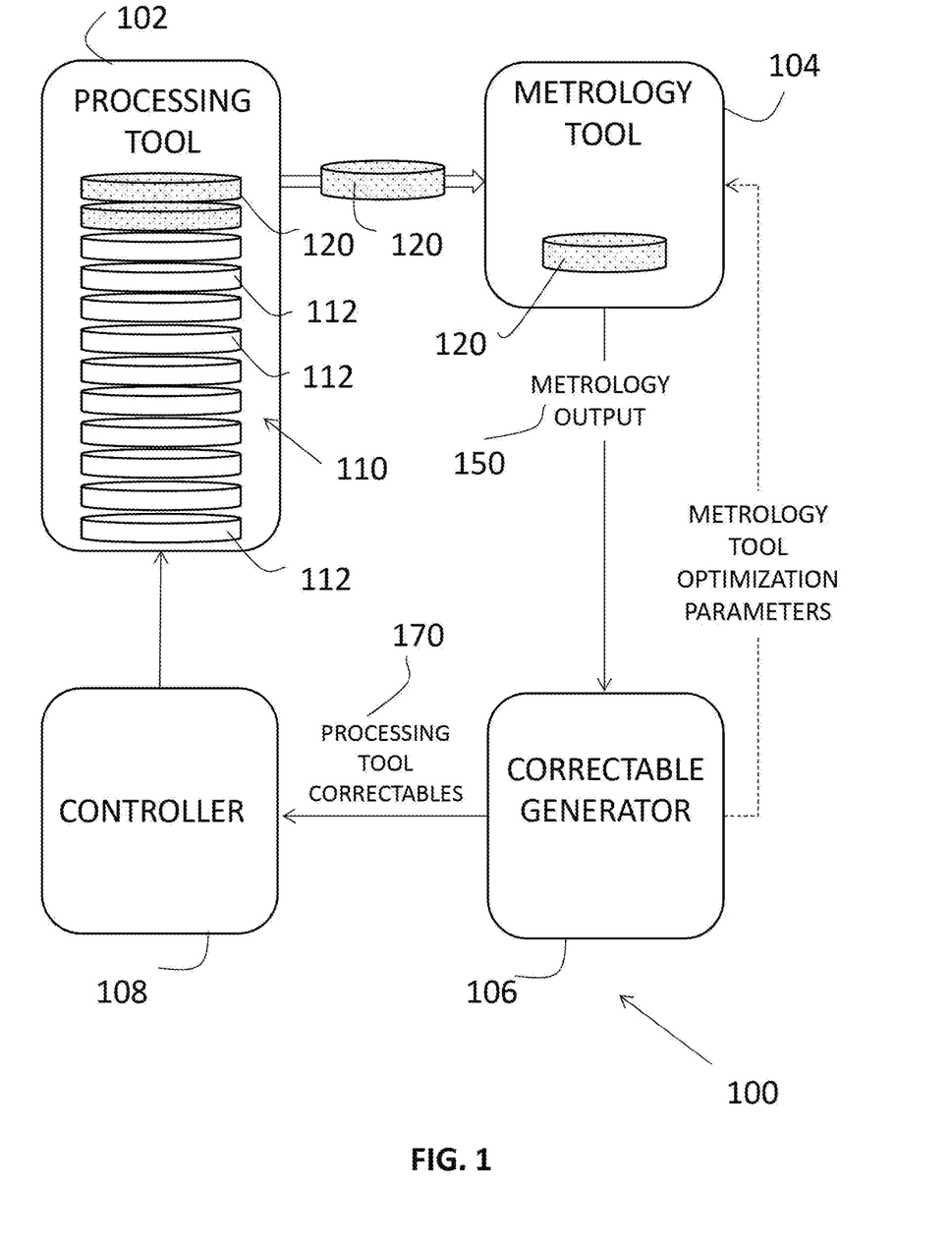
FIG. 1 is a simplified schematic partially pictorial, partially block diagram illustration of a semiconductor wafer processing system including feedforward control, constructed and operative in accordance with a preferred embodiment of the present invention.

Reference is now made to FIG. 1, which is a simplified schematic partially pictorial, partially block diagram illustration of a semiconductor wafer processing system including feedforward control, constructed and operative in accordance with a preferred embodiment of the present invention.

As seen in FIG. 1, there is provided a semiconductor wafer processing system 100 preferably including a semiconductor processing tool 102, a metrology tool 104, a correctable generator 106 for generating correctables based on the output of metrology tool 104 and a controller 108 for controllably adjusting the processing performed by processing tool 102 in accordance with the correctables generated by correctable generator 106.

Processing tool 102 is preferably operative to process at least one lot 110 of semiconductor wafers 112. Lot 110 may be a member of a batch of semiconductor wafers including a number of wafer lots preferably, although not necessarily, of the same type as lot 110, as is described henceforth with reference to FIG. 3. Typically, lot 110 may include 25 semiconductor wafers 112, although fewer wafers 112 are illustrated herein for the purpose of succinctness.

Processing tool 102 is preferably embodied as a lithographic patterning tool, such as a scanner. An example of a processing tool useful in the system of FIG. 1 is the ASML scanner 1950i, commercially available from ASML of Veldhoven, Netherlands. During processing, lot 110 is preferably retained on a stage of processing tool 102, typically on two chucks thereon.

Metrology tool 104 is preferably embodied as a misregistration measurement tool, for measuring misregistration between layers of each of semiconductor wafers 112. Metrology tool 104 may be an imaging type tool or a scatterometry type tool. An example of a metrology tool useful in the system of FIG. 1 is the Archer ATL100, commercially available from KLA of California, USA. Processing tool 102 and metrology tool 104 are preferably located at a common location such that semiconductor wafers 112 processed by processing tool 102 may be readily transferred to metrology tool 104 for the performance of metrology thereon.

It is a particular feature of a preferred embodiment of the present invention that lot 110 preferably includes at least one Design of Experiment (DOE) semiconductor wafer 120. Here, by way of example, lot 110 is shown to include two DOE wafers 120 schematically indicated in FIG. 1 by hatching in order to distinguish DOE wafers 120 from the other, non-DOE wafers 112 included in lot 110 and manufactured using standard design parameters. In other preferred embodiments of the present invention, lot 110 may include 2-4 DOE wafers 120, for example equally distributed between the two chucks of processing tool 102.

Preferably, the one or more DOE wafers 120 are generated by processing tool 102 based on variation of DOE parameters across the DOE wafer 120. Particularly preferably, the DOE parameters are parameters associated with misregistration of layers of wafer 120 with respect to each other, which misregistration is preferably measured by metrology tool 104. By way of example, the DOE parameter variation may be a shift in the relative locations or pitches of misregistration measurement targets formed on adjacent layers of wafer 120 so as to deliberately create misregistration therebetween of various magnitudes, such as by 5 nm, 10 nm, 15 nm and so on. The DOE parameter may alternatively be a shift in the locations of misregistration targets, for example with respect to die edges, as well as variation in processing tool 102 parameters such as, by way of example only, rotation, translation, focus and dose.

Figure 2:
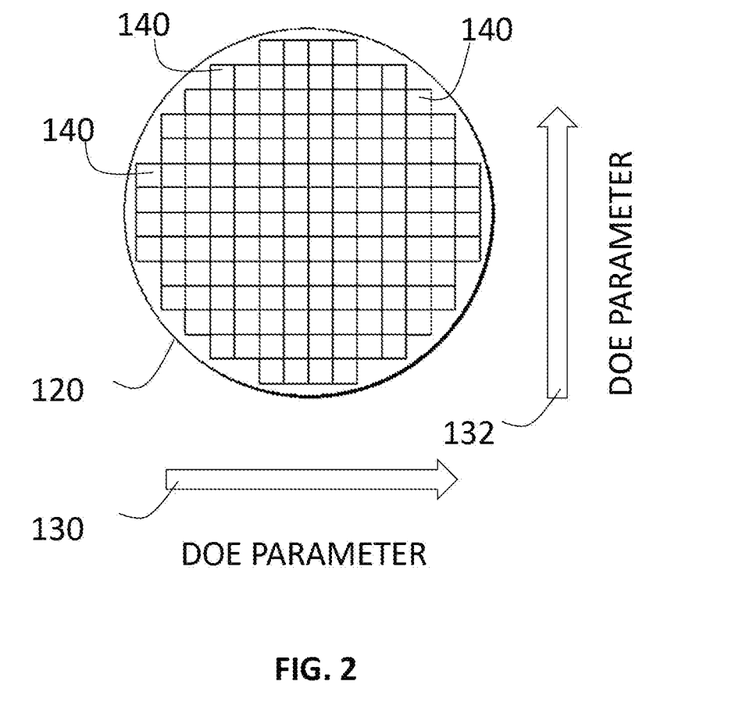
FIG. 2 is a simplified schematic illustration of a DOE semiconductor wafer processed by a system of the type shown in FIG. 1.

Turning additionally to FIG. 2, the DOE parameter of DOE wafer 120 may be varied across DOE wafer 120 in both an x-direction and a y-direction, as respectively indicated by x- and y-direction DOE parameter variation arrows 130 and 132. Although not illustrated in FIG. 2, it is understood that the DOE parameter may be varied at a wafer level, per field of wafer 120 or may be varied at a field level, per wafer die 140. The DOE parameter may be varied in a predetermined continuous or discrete manner within the field and/or die, the variation being preferably repeated between fields and/or dies. Preferably, different. DOE parameters are varied per DOE wafer 120 included in each lot 110. It is understood that, with the exception of the particular DOE parameter varied across DOE wafer 120, another characteristics of DOE wafer 120 are generally the same as those of other wafers 112 included in lot 110 to which DOE wafer 120 belongs.

Returning to FIG. 1, following generation of DOE wafer 120 by processing tool 102, the DOE wafer 120 is preferably physically transferred to metrology tool 104 for the performance of metrology thereon and particularly preferably, for the measurement of misregistration between targets formed on layers of DOE wafer 120, which misregistration may be deliberately induced in DOE wafer 120 by way of variation of the DOE parameter thereacross.

Metrology tool 104 is preferably operative to perform metrology on at least one DOE wafer 120 and to output a metrology output 150. Metrology output 150 is preferably provided to correctable generator 106. Correctable generator 106 is preferably operative to receive and analyze metrology output 150 and to generate one or more correctables to the patterning process performed by processing tool 102 based thereon. Correctable generator 106 may be operative to generate one or more correctables based on correlating the misregistration as measured by metrology tool 104 to the actual known induced misregistration on the DOE wafer 120. Additionally or alternatively, the correctables may be found by comparing the misregistration measured by metrology tool 104 to pre-existing models of misregistration and ascertaining differences therebetween. More generally, the correctables may be found by any approach for correlating the metrology output of metrology tool 104 to the DOE parameter of DOE wafer 120, in order to ascertain correctables which may be applied to processing tool 102 in order to improve the processing of wafers 112 thereby, and particularly preferably to minimize misregistration between layers thereof.

Correctable generator 106 is preferably embodied as a hardware or software module, including computer code operative to automatically analyze metrology output 150 and calculate correctables applicable to the process performed by processing tool 102 based thereon. It is appreciated that although correctable generator 106 is illustrated in FIG. 1 as a separate module, outside of both metrology tool 104 and processing tool 102, the functionality of correctable generator 106 may alternatively be included therein. It is further appreciated that correctable generator 106 may be a cloud-based module, in wireless communication at least with metrology tool 102.

It is understood that during the performance of metrology on DOE wafer 120 by metrology tool 104, as well as during the analysis of metrology output 150 by correctable generator 106, processing tool 102 preferably, although not necessarily, continues to process other wafers 112 included in lot 110 in accordance with the non-adjusted processing parameters thereof.

Correctable generator 106 is preferably operative to output processing tool correctables 170 and to provide processing tool correctables 170 to controller 108. Controller 108 is preferably operative to receive processing tool correctables 170 and to adjust the process performed by processing tool 102 in accordance with processing tool correctables 170. It is appreciated that such adjustment is preferably carried out during the processing of other wafers 112 of lot 110 by processing tool 102, such that the correctables found by correctable generator 106 based on DOE wafer 120 of a given lot are immediately applied to the processing tool 102 during processing of that given lot, in order to improve the processing of other wafers 112 within the same lot as DOE wafer 120. Additionally or alternatively, such adjustment may be carried out during the processing of other lots of semiconductor wafers included the same batch as that to which lot 110 including DOE wafer 120 belongs.

It is appreciated that the rapid calculation and provision of correctables to processing tool 102, allowing the adjustment of the processing performed by processing tool 102 within the same lot as that for which the correctables were calculated, is enabled in the present invention due to performance of metrology on at least one DOE wafer 120, based on which correctables are calculated. This is in contrast to conventional processing systems, in which metrology measurements are typically performed on nominal wafers selected from a lot of wafers and correctables calculated based on the metrology measurements performed on the nominal wafers. In such conventional processing systems, the performance of metrology and calculation of correctables is relatively slow, such that adjustments to the processing tool are not feasible within the present lot for which the metrology is performed, but rather only applied to subsequent lots. However, in the present invention, metrology is advantageously performed on a DOE wafer, which metrology is both more rapid and more accurate than the performance of metrology on a nominal wafer. The performance of metrology on a DOE wafer is more rapid than that on a nominal wafer at least due to the necessity of sampling fewer sites on the DOE wafer and due to the lower re-work rate. By way of example, the metrology measurements may be performed on the DOE wafer 120, correctables derived and the operation of processing tool 102 adjustably controlled accordingly within a time scale of several minutes, whereas the processing of the entirety of lot 110 may take several hours.

Figure 3:
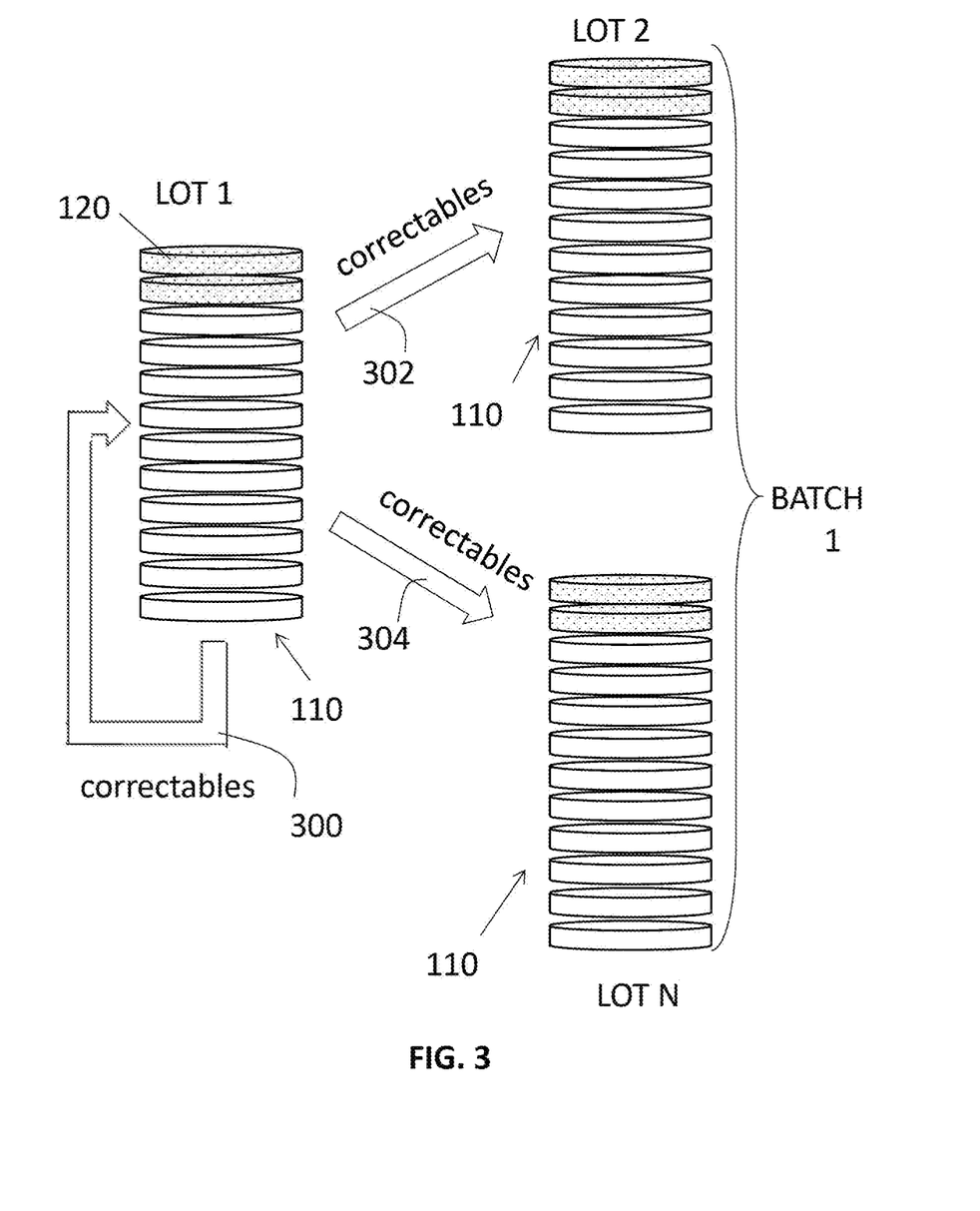
FIG. 3 is a simplified schematic illustration of feedforward control flow in a system of the type shown in FIG. 1.

The feedforward control flow enabled by a system of the type shown in FIG. 1 is illustrated schematically in FIG. 3. As seen in FIG. 3, correctables generated based on metrology performed on a DOE wafer 120 belonging to an initial lot 110, here indicated as LOT 1, may be applied to other wafers within LOT 1, as indicated by an arrow 300. Additionally or alternatively, correctables generated based on metrology performed on a DOE wafer 120 of LOT 1 are preferably applied to other lots, such as LOT 2 and LOT N, as respectively indicated by arrows 302 and 304. LOTS 1, 2 and N all preferably belong to the same batch, here shown as BATCH 1. It appreciated that feedforward control of the operation of processing tool 102, so as to correct the operation of processing tool 102 within the current lot and/or current batch, improves the throughput of system 100 by minimizing the misregistration and thus reducing the re-work of wafers 112 processed thereby.

It is understood that correctables may be calculated per DOE wafer 120 of lot 110 and the operation of processing tool 102 adjusted accordingly, incrementally based on the metrology output per DOE wafer 120. Alternatively, the correctables may be calculated per all of the DOE wafers 120 included in lot 110 and the operation of processing tool 102 adjusted based on the collective correctables derived from the metrology outputs for all of the DOE wafers 120 in a given lot 110. It is appreciated that correctables derived based on the metrology output for one DOE wafer 120 typically differ and may be interdependent with respect to correctables derived based on the metrology output for another DOE wafer 120 having a different DOE parameter. The interdependency of the correctables may be accounted for by algorithms included in controller 108 and/or processing tool 102.

The adjustments applied to processing tool 102 by controller 108 based on correctables 170 may include adjustments to a range of parameters of processing tool 102. For example, in the case that the DOE parameter of DOE wafer 120 is rotation, the correctable derived may be a correctable to rotation and controller 108 may adjust the rotation of processing tool 102 so as to minimize the misregistration of wafers 112 produced thereby. Further by way of example, in the case that the DOE parameter of the DOE wafer 120 is induced misregistration by shift of misregistration targets, the correctable derived may be a correctable to the location at which misregistration targets are formed on wafer 112.

In accordance with one preferred embodiment of the present invention, in addition to the calculation of correctables to the process performed by processing tool 102, metrology performed on DOE 120 may also optionally be used to calculate correctables for the purpose of optimizing the operation of metrology tool 104. This is based on the understanding that the metrology output 150 of metrology tool 104 represents the misregistration values of the DOE wafer 120 only as accurately measured by the metrology tool 104, such that settings of the metrology tool 104 tend to influence the misregistration values measured thereby. As shown in FIG. 1, correctable generator 106 may thus optionally be operative to find metrology tool optimization parameters, based on the metrology output 150, and the operation of metrology tool 104 adjusted based thereon in order to optimize the accuracy of the metrology performed thereby. By way of example, metrology tool 104 may adjusted to operate in a more internally consistent manner.

Figure 4:
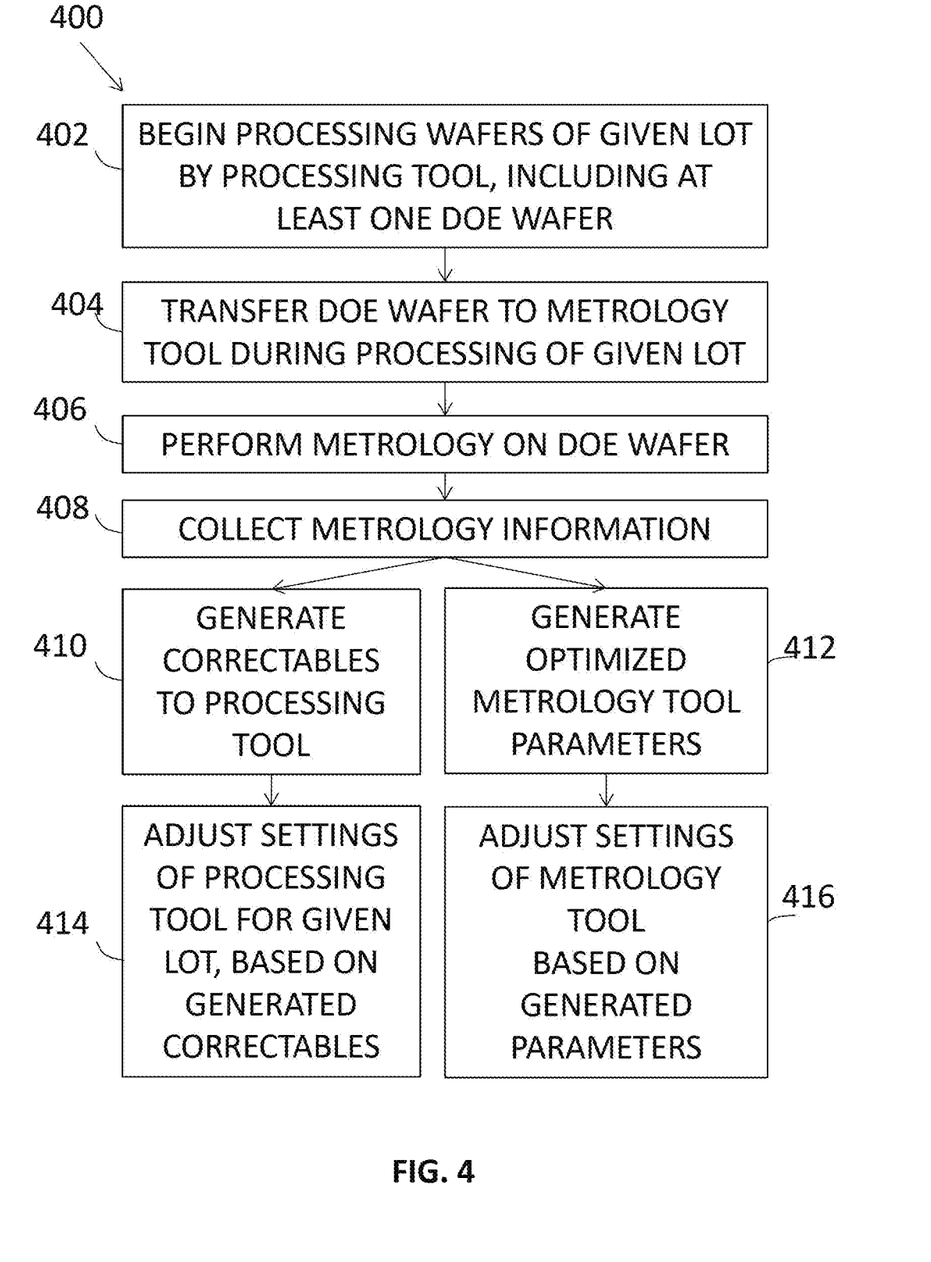
FIG. 4 is a simplified flow chart illustrating steps involved in process control in semiconductor wafer processing, in accordance with a preferred embodiment of the present invention.

Reference is now made to FIG. 4, which is a simplified flow chart illustrating steps involved in process control in semiconductor wafer processing, in accordance with a preferred embodiment of the present invention.

As seen in FIG. 4, a method 400 for the feedforward control of semiconductor processing may begin at a first step 402, at which wafers of a given lot are processed or patterned by a processing tool, including the generation within the given lot of at least one DOE wafer. As seen at a second step 404, the DOE wafer is preferably then transferred to a metrology tool. Preferably, second step 404 is carried out during the processing of other wafers of the lot as begun at first step 402. As seen at a third step 406, metrology is performed on the DOE wafer and metrology information collected, as seen at a fourth step 408.

As seen at parallel fifth and sixth steps 410 and 412, based on the metrology information collected at fourth step 408, correctables respectively related to operation of the processing tool and metrology tool are preferably derived. As seen at fifth step 410, correctables to the processing performed by the processing tool are preferably generated. As seen at sixth step 412, which may or may not be performed simultaneously with fifth step 410, optimized parameters relevant to the performance of the metrology tool may additionally be generated.

Following the performance of fifth step 410, the correctables derived at fifth step 410 are preferably used as a basis for the controlled adjustment of the processing tool during the processing of the same given lot as referenced in first step 402, as seen at a seventh step 414.

Additionally or alternatively, following the performance of sixth step 412, the optimized parameters derived as sixth step 412 are preferably used as a basis for the controlled adjustment of the settings of the metrology tool in order to improve the operation thereof, as seen at an eighth step 416.

It is appreciated that as a result of the performance of metrology on a DOE wafer and the calculation of correctables based thereon, correctables may be rapidly and high accurately calculated in accordance with the preferred method 400 of the present invention. The correctables found may be used for feedforward control of the operation at least of the processing tool within the same lot or batch for which the correctables were found, thereby improving the throughput of the processing tool.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A method for process control in the manufacture of semiconductor devices comprising:
   generating at least one Design of Experiment (DOE) semiconductor wafer prior to performing metrology thereon, wherein said generating said DOE semiconductor wafer comprises varying at least one DOE parameter across said DOE semiconductor wafer, and wherein said DOE parameter is associated with misregistration of layers of said DOE semiconductor wafer with respect to each other;
   performing said metrology on said at least one DOE semiconductor wafer included in a lot of semiconductor wafers, said lot forming part of a batch of semiconductor wafer lots, wherein said metrology comprises measurement of misregistration between said layers of said DOE semiconductor wafer;
   generating, based on said metrology, one or more correctables to a process used to manufacture said lot of semiconductor wafers; and
   adjusting, based on said correctables, said process performed on at least one of:
      other semiconductor wafers included in said lot of semiconductor wafers, and
      other lots of semiconductor wafers included in said batch.

2. The method according to claim 1, wherein said process comprises a lithographic patterning process performed by a lithographic patterning tool.

3. The method according to claim 1, and also comprising performing said process used to manufacture said lot of semiconductor wafers during said performing of said metrology, prior to said adjusting of said process.

4. The method according to claim 1, wherein said DOE parameter comprises one of misalignment of targets used for measurement of misregistration between layers of said DOE semiconductor wafer and other parameters related to misregistration between said layers of said DOE semiconductor wafer.

5. The method according to claim 4, wherein said other parameters related to misregistration comprise parameters of said lithography patterning tool including translation, rotation, focus and dose.

6. The method according to claim 1, wherein said varying of said DOE parameter comprises at least one of varying said DOE parameter per field of said DOE semiconductor wafer and per die of said DOE semiconductor wafer.

7. The method according to claim 1, and also comprising generating, based on said metrology, one or more correctables to performance of said metrology, whereby said performance of said metrology is optimized.

8. A system for process control in the manufacture of semiconductor devices comprising:
   a metrology tool operative to perform metrology on at least one Design of Experiment (DOE) semiconductor wafer included in a lot of semiconductor wafers, said lot forming part of a batch of semiconductor wafer lots, wherein said metrology comprises measurement of misregistration between layers of said DOE semiconductor wafer, wherein said DOE semiconductor wafer includes at least one DOE parameter varied across said DOE semiconductor wafer, and wherein said DOE parameter is associated with misregistration of layers of said DOE semiconductor wafer with respect to each other;
   a correctable generator operative to generate, based on said metrology, one or more correctables to a process used to manufacture said lot of semiconductor wafers; and
   a controller operative to receive said correctables generated by said correctable generator and to controllably adjust said process, in accordance with said correctables, performed on at least one of:
      other semiconductor wafers included in said lot of semiconductor wafers, and
      other lots of semiconductor wafers included in said batch.

9. The system according to claim 8, wherein said process comprises a lithographic patterning process performed by a lithographic patterning tool.

10. The system according to claim 9, wherein said lithographic patterning tool is operative to perform said process to manufacture said lot of semiconductor wafers during performance of said metrology, prior to said process being adjusted by said controller.

11. The system according to claim 9, wherein said lithographic patterning tool is operative to generate said DOE semiconductor wafer.

12. The system according to claim 11, wherein said lithographic patterning tool is operative to vary said at least one DOE parameter across said DOE semiconductor wafer.

13. The system according to claim 12, wherein said DOE parameter is varied per at least one of a field of said DOE semiconductor wafer and a die of said DOE semiconductor wafer.

14. The system according to claim 12, wherein said DOE parameter comprises one of misalignment of targets used for measurement of misregistration between layers of said DOE semiconductor wafer and other parameters related to misregistration between said layers of said DOE semiconductor wafer.

15. The system according to claim 14, wherein said other parameters related to misregistration comprise parameters of said lithography patterning tool including translation, rotation, focus and dose.

16. The system according to claim 8, wherein said correctable generator is operative to generate, based on said metrology, one or more correctables to performance of said metrology by said metrology tool, whereby said performance of said metrology tool is optimized.

* * * * *